United States Patent
Jiang et al.

(10) Patent No.: US 10,886,140 B2
(45) Date of Patent: Jan. 5, 2021

(54) 3D NAND ETCH

(71) Applicant: Applied Materials, Inc., Santa Clara, CA (US)

(72) Inventors: Shishi Jiang, Santa Clara, CA (US); Pramit Manna, Sunnyvale, CA (US); Bo Qi, San Jose, CA (US); Abhijit Basu Mallick, Palo Alto, CA (US); Rui Cheng, Santa Clara, CA (US); Tomohiko Kitajima, San Jose, CA (US); Harry S. Whitesell, Sunnyvale, CA (US); Huiyuan Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/523,262

(22) Filed: Jul. 26, 2019

(65) Prior Publication Data
US 2020/0035505 A1 Jan. 30, 2020

Related U.S. Application Data

(60) Provisional application No. 62/743,877, filed on Oct. 10, 2018, provisional application No. 62/711,285, filed on Jul. 27, 2018.

(51) Int. Cl.
*H01L 21/311* (2006.01)
*H01L 21/02* (2006.01)
*H01L 27/11551* (2017.01)
*H01L 27/11578* (2017.01)

(52) U.S. Cl.
CPC .... *H01L 21/31144* (2013.01); *H01L 21/0228* (2013.01); *H01L 21/02063* (2013.01); *H01L 21/02112* (2013.01); *H01L 27/11551* (2013.01); *H01L 27/11578* (2013.01)

(58) Field of Classification Search
None
See application file for complete search history.

(56) References Cited

U.S. PATENT DOCUMENTS

| | | | | |
|---|---|---|---|---|
| 5,767,018 A | * | 6/1998 | Bell | H01L 21/32135 257/E21.31 |
| 8,883,648 B1 | * | 11/2014 | Hsieh | H01L 21/76802 257/E23.011 |
| 9,385,318 B1 | * | 7/2016 | Henri | H01L 45/144 |
| 10,147,638 B1 | * | 12/2018 | Williamson | H01L 27/11575 |

(Continued)

FOREIGN PATENT DOCUMENTS

KR 20140036203 A 3/2014

OTHER PUBLICATIONS

PCT International Search Report and Written Opinion in PCT/US2019/043648 dated Oct. 31, 2019. 15 pages.

(Continued)

*Primary Examiner* — Allan W. Olsen
(74) *Attorney, Agent, or Firm* — Servilla Whitney LLC

(57) ABSTRACT

Methods of etching film stacks to from gaps of uniform width are described. A film stack is etched through a hardmask. A conformal liner is deposited in the gap. The bottom of the liner is removed. The film stack is selectively etched relative to the liner. The liner is removed. The method may be repeated to a predetermined depth.

19 Claims, 1 Drawing Sheet

(56) References Cited

U.S. PATENT DOCUMENTS

| | | | |
|---|---|---|---|
| 2003/0143853 A1* | 7/2003 | Celii | H01L 21/31122 |
| | | | 438/694 |
| 2005/0095783 A1* | 5/2005 | Haselden | H01L 21/32137 |
| | | | 438/257 |
| 2011/0006284 A1* | 1/2011 | Cho | G02B 1/005 |
| | | | 257/14 |
| 2014/0038412 A1* | 2/2014 | Hu | H01L 21/76811 |
| | | | 438/689 |
| 2014/0273462 A1* | 9/2014 | Simsek-Ege | H01L 29/66825 |
| | | | 438/696 |
| 2017/0178920 A1 | 6/2017 | Dole et al. | |
| 2018/0076042 A1* | 3/2018 | Cheng | H01L 21/02381 |

OTHER PUBLICATIONS

Chung, Chen-Kuei , "Plasma Etching", Springer Link, Encyclopedia of Microfluidics and Nanofluidics, DOI: 10.1007/978-3-642-27758-0_1251-5, Aug. 7, 2014, pp. 1-18.

Lee, Hyo-Chang , "Review of inductively coupled plasmas: Nano-applications and bistable hysteresis physics", Applied Physics Reviews 5, 011108 (2018), Mar. 15, 2018, pp. 1-25.

Zhu, Fuyun , et al., "A Three-Step Model of Black Silicon Formation in Deep Reactive Ion Etching Process", 2015 28th IEEE International Conference on Micro Electro Mechanical Systems (MEMS), Jan. 22, 2015, pp. 365-368.

\* cited by examiner

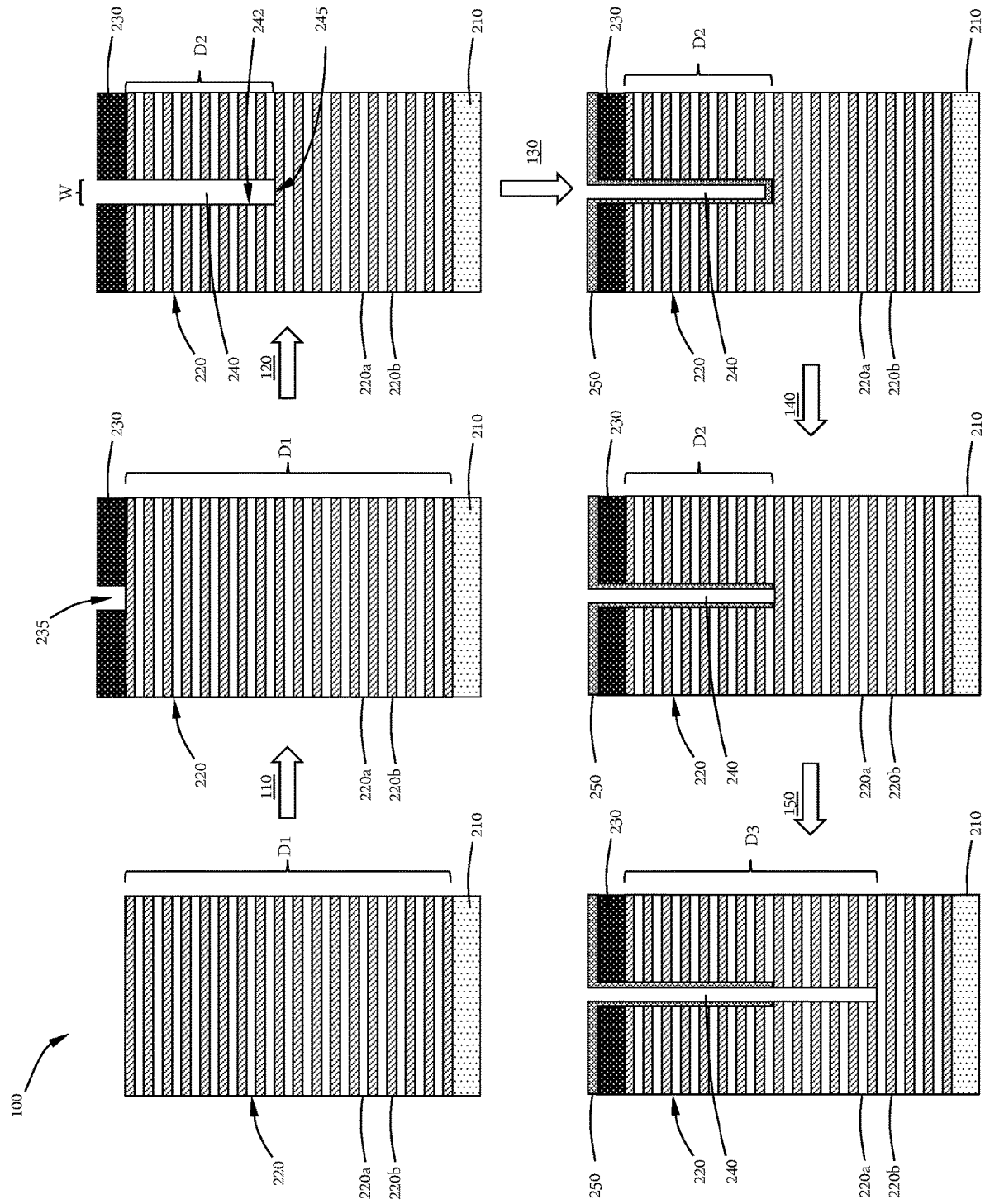

3D NAND ETCH

CROSS-REFERENCE TO RELATED APPLICATIONS

This application claims priority to U.S. Provisional Application No. 62/743,877, filed Oct. 10, 2018, and U.S. Provisional Application No. 62/711,285, filed Jul. 27, 2018, the entire disclosures of which are hereby incorporated by reference herein.

TECHNICAL FIELD

Embodiments of the disclosure generally relate to etch methods for forming a gap or feature in a semiconductor device. More specifically, embodiments of the disclosure relate to etch methods for forming wordlines in three dimensional semiconductor devices.

BACKGROUND

Semiconductor and electronics processing industries continue to strive for larger production yields while increasing the uniformity of layers deposited on substrates having larger surface areas. These same factors in combination with new materials also provide higher integration of circuits per area of the substrate. As circuit integration increases, the need for greater uniformity and process control regarding layer thickness rises. As a result, various technologies have been developed to deposit and etch layers on substrates in a cost-effective manner, while maintaining control over the physical and chemical characteristics of the layer.

V-NAND, or 3D-NAND, structures are used in flash memory applications. V-NAND devices are vertically stacked NAND structures with a large number of cells arranged in blocks. Prior to wordline formation, the substrate is a layered oxide stack. A memory string is formed in a gap or slit that passes vertically through the layered oxide stack.

Generally, formation of a 3D NAND structure requires etching a straight profile within a film stack. However, current etch processes, particularly with thicker film stacks, damage the sidewalls of the etched gap to provide sidewalls which are bowed in the middle of the film stack. These gaps are not of uniform thickness and may provide varying resistance when the gap is later filled with a conductive material.

Formation of a gap of uniform thickness is challenging due to the loading effect of the etch process. Current etch processes often damage the sidewall of the gap during etching of thick stacks, resulting in a non-uniform gap thickness at the top of the stack than at the middle or bottom. This difference often becomes more pronounced with increasing oxide stack layers.

Therefore, there is a need in the art for methods for forming wordline gaps of uniform thickness in three-dimensional structured devices.

SUMMARY

One or more embodiments of the disclosure are directed to methods of etching a film stack. The methods comprise providing a substrate with a film stack of a first thickness formed thereon. The film stack is etched to a depth of a second thickness to form a gap of substantially uniform width with a sidewall and a bottom. The second thickness is less than the first thickness. A liner is deposited on the sidewall and the bottom of the gap. The liner is etched from the bottom of the gap. The film stack is selectively etched relative to the liner to a depth of a third thickness to extend a depth of the gap. The liner is removed.

Additional embodiments of the disclosure are also directed to methods of etching a film stack. The methods comprise providing a substrate with a film stack of a first thickness formed thereon. The film stack comprises alternating layers of an oxide and a nitride. A patterned hardmask is formed on the film stack. The film stack is etched through the hardmask to a depth of a second thickness to form a gap of substantially uniform width with a sidewall and a bottom. The second thickness is less than the first thickness. A conformal liner is deposited by atomic layer deposition on the sidewall and the bottom of the gap. The conformal liner comprises boron. The liner is etched from the bottom of the gap. The film stack is selectively etched relative to the liner to a depth of a third thickness to extend a depth of the gap. An anneal of the substrate is performed under an oxidizing atmosphere to remove the liner.

Further embodiments of the disclosure are directed to methods of etching a film stack. The methods comprise providing a substrate with a film stack formed thereon of a first thickness in a range of about 3000 nm to about 7000 nm. The film stack comprises alternating layers of an oxide and a nitride. A patterned hardmask is formed on the film stack with openings exposing the film stack. The openings have a width in a range of about 1 nm to about 100 nm. The film stack is etched through the hardmask to a depth of a second thickness to form a gap of substantially uniform width with a sidewall and a bottom. The second thickness is less than the first thickness. A substantially conformal liner is deposited by atomic layer deposition on the sidewall and the bottom of the gap. The conformal liner comprises boron and carbon. The liner is etched from the bottom of the gap. The film stack is selectively etched relative to the liner to a depth of a third thickness to extend a depth of the gap. The liner is removed by a process comprising an anneal under a steam atmosphere at a temperature greater than or equal to about 500° C. and an oxygen plasma ash at a temperature in a range of about 300° C. to about 400° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

The FIGURE depicts a flow process diagram of a method of etching a film stack according to one or more embodiments described herein.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure advantageously provide methods of etching film stacks which provide gaps of uniform width. Without being bound by theory, it is believed that the use of shallower etches and protective liners provides for processes with less sidewall damage and gaps of more uniform width through the film stack.

As used herein, a gap of "substantially uniform" width refers to a gap where the width is about the same throughout (e.g., at the top, middle and bottom of the gap). Without being bound by theory, it is assumed that a gap of exactly uniform width will be more difficult to achieve. Therefore, a gap of substantially uniform width is a gap where the width varies by less than or equal to about 10%, 5%, 2%, 1% or 0.5%.

As used herein, a liner which is "substantially conformal" refers to a liner where the thickness is about the same throughout (e.g., on the top, middle and bottom of sidewalls and on the bottom of the gap). A liner which is substantially conformal varies in thickness by less than or equal to about 10%, 5%, 2%, 1% or 0.5%.

As used herein, a etch process which is "substantially directional" refers to a process which removes quantities of a material in one direction over another direction (e.g., removes a vertical trench from a film stack, without etching the sidewalls of the trench). A process which is substantially directional preferentially removes material in a first direction at a rate that is 10, 20, 50 or 100 times faster than material removed in a second direction orthogonal to the first.

The FIGURE depicts a flow diagram of a method 100 of etching a film stack in accordance with one or more embodiments of the disclosure. With reference to the FIGURE, the method 100 begins with a substrate 210 with a film stack 220 formed thereon. The film stack 220 is comprised of multiple layers 220a, 220b. In some embodiments, the multiple layers 220a, 220b alternate in the film stack 220. In some embodiments, the film stack 220 comprises more than two alternating layers. In some embodiments, the film stack 220 comprises a number of layers in a range of about 2 layers to about 500 layers, in a range of about 20 layers to about 200 layers, in a range of about 50 layers to about 150 layers, in a range of about 80 layers to about 150 layers, or in a range of about 100 layers to about 120 layers.

The film stack 220 formed on the substrate 210 has a thickness D1, also referred to as a first thickness. In some embodiments, the first thickness is in a range of about 3000 nm to about 7000 nm. Each of the individual layers has an individual thickness. In some embodiments, the individual thickness is in a range of about 100 Å to about 3000 Å, about 100 Å to about 500 Å, or in a range of about 500 Å to about 3000 Å.

In some embodiments, the film stack 220 comprises alternating layers of an oxide and a nitride. In some embodiments, the film stack 220 comprises alternating layers of an oxide and a polysilicon stack.

In some embodiments, at operation 110, a patterned hardmask 230 is formed on the film stack 220. The patterned hardmask 230 may be formed by any suitable process. In some embodiments, the patterned hardmask 230 is formed as a blanket hardmask and subsequently etched to form a patterned hardmask 230. In some embodiments, the patterned hardmask 230 is deposited as a hardmask with a pattern (e.g., patterned printing). In some embodiments, operation 110 is not performed and the method 100 begins with the patterned hardmask 230 on the film stack 220.

The patterned hardmask 230 has openings 235 which expose portions of the film stack 220. In some embodiments, the openings 235 have a width in a range of about 1 nm to about 100 nm, about 2 nm to about 80 nm, about 3 nm to about 75 nm, about 4 nm to about 50 nm, or about 5 nm to about 50 nm.

At operation 120, the film stack 220 is etched to a depth of a second thickness, D2. The second thickness D2 is less than the first thickness D1. Stated differently, the etch process at operation 120 does not etch the entire film stack 220. The etch process at operation 120 forms a gap 240. The gap 240 has at least one sidewall 242 and a bottom 245. The gap 240 has a width W that is substantially uniform.

At operation 130, a liner 250 is deposited on the at least one sidewall 242 and the bottom 245 of the gap 240. In some embodiments, the liner 250 comprises boron (B). In some embodiments, the liner 250 further comprises nitrogen (N) or carbon (C). In some embodiments, the liner 250 comprises one or more of boron, boron nitride (BN), boron carbide (BC) or boron carbonitride (BCN).

At operation 130, the liner may be deposited by any suitable process. In some embodiments, the liner 250 is deposited by atomic layer deposition (ALD). In some embodiments, the liner is deposited by chemical vapor deposition (CVD).

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface are exposed simultaneously to the two or more reactive compounds so that no given point on the substrate is exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended. As used herein, "chemical vapor deposition" refers to a process in which a substrate surface is exposed to precursors and/or co-reagents simultaneously or substantially simultaneously. As used herein, "substantially simultaneously" refers to either a co-flow or where there is an intentional overlap of the precursors.

In some embodiments, the liner 250 is continuous. In some embodiments, the liner 250 is substantially conformal. In some embodiments, the liner 250 is thicker on the at least one sidewall 242 of the gap 240 than the bottom 245 of the gap 240. In some embodiments, the thickness on the at least one sidewall 242 of the gap 240 is greater than or equal to about 100 percent, greater than or equal to about 110 percent, greater than or equal to about 120 percent, greater than or equal to about 125 percent, greater than or equal to about 150 percent, or greater than or equal to about 200 percent of the thickness of the liner 250 on the bottom 245 of the gap 240. In some embodiments, the liner 250 has a thickness on one sidewall in a range of about 10 Å to about 50 Å. In some embodiments, the liner 250 has a thickness which is evaluated relative to the width of the opening 235. In some embodiments, the liner 250 has a thickness on opposite sidewalls of the gap 240 which comprises less than or equal to about 50%, less than or equal to about 30%, less than or equal to about 25%, less than or equal to about 20%, or less than or equal to about 10% of the total width of the opening 235.

At operation 140, the liner 250 is etched from the bottom 245 of the gap 240 to expose the film stack 220.

At operation 150, the film stack 220 is selectively etched relative to the liner 250 to a depth of a third thickness D3. Etching the film stack 220 at 150 extends the total depth of the gap 240.

In some embodiments, the sum of second thickness D2 and the third thickness D3 is less than the first thickness D1. Stated differently, the etch process at operation 150 does not etch the entire film stack 220. In some embodiments, operations 130 140 and 150 may be repeated until a predetermined thickness has been etched from the film stack 220.

As used herein, the phrase "selectively etched", or similar, means that the subject materials are etched to a greater extent than other materials. In some embodiments, "selectively" means that the subject material is removed at a rate greater than or equal to about 10×, 15×, 20×, 25×, 30×, 35×, 40×, 45× or 50× the rate of removal from the non-selected surface. Without being bound by theory, it is believed that the liner 250 protects the at least one sidewall 242 of the gap 240 during operation 150, enabling the selective etching of the film stack.

In some embodiments, not illustrated, after operation 150, the liner 250 is removed from the at least one sidewall 242. In some embodiments, the liner 250 is removed by a process comprising an anneal in an oxidizing atmosphere. In some embodiments, the oxidizing atmosphere comprises one or more of $O_2$, $O_3$, $H_2O$, $H_2O_2$, $CO$, $CO_2$, $N_2O$, $NO_2$ or $NO$. In some embodiments, the anneal is performed at a temperature greater than or equal to about 450° C., greater than or equal to about 500° C., greater than or equal to about 600° C., greater than or equal to about 750° C., greater than or equal to about 1000° C., greater than or equal to about 1100° C., or greater than or equal to about 1200° C. In some embodiments, the liner is removed by a process comprising a water plasma. In some embodiments, the liner is removed by a process comprising an oxygen plasma ash. In some embodiments, the oxygen plasma ash is performed at a temperature in a range of about 300° C. to about 400° C.

Without being bound by theory, it is believed that for liners comprising boron, the boron can be removed by the steam anneal process. Further, for liners comprising carbon, the carbon can be removed by the oxygen plasma ash process.

Operations 120 and 150 each involve etching the film stack 220. Operation 140 involves etching the bottom of the liner 250. The etch process used in operations 120, 140 and 150 may be any suitable etch processes. The etch process used in operation 150 may be any suitable etch processes that is selective to the film stack 220 over the liner 250. In some embodiments, the etch process in operation 120 is substantially directional. In some embodiments, the etch process in operation 140 is substantially directional. In some embodiments, the etch process in operation 150 is substantially directional. In some embodiments, the etch processes utilized in operations 120 and 150 are similar processes. In some embodiments, the etch process utilized in operation 140 is different from either the etch process utilized in operation 120 or the etch process utilized in operation 150. As used in this regard, similar etch processes are performed using the same reagents under the same conditions. A skilled artisan will appreciate that the conditions may vary slightly between similar processes and such variations are within the scope of the disclosure.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of etching a film stack, the method comprising:
   etching a film stack comprising alternating layers of an oxide and a nitride an having a first thickness to a depth of a second thickness to form a gap with a substantially uniform width, a sidewall and a bottom, the second thickness being less than the first thickness;
   depositing a liner on the sidewall and the bottom of the gap;
   etching the liner from the bottom of the gap;
   selectively etching the film stack relative to the liner to a depth of a third thickness to extend a depth of the gap; and
   removing the liner.

2. The method of claim 1, wherein the alternating layers have a thickness in a range of about 500 Å to about 3000 Å.

3. The method of claim 1, further comprising forming a patterned hardmask on the film stack before etching.

4. The method of claim 3, wherein openings in the patterned hardmask expose portions of the film stack to be etched.

5. The method of claim 4, wherein the openings have a width in a range of about 1 nm to about 100 nm.

6. The method of claim 1, wherein the liner comprises boron.

7. The method of claim 6, wherein the liner comprises one or more of B, BN, BC, or BCN.

8. The method of claim 1, wherein the liner is substantially conformal and deposited by atomic layer deposition.

9. The method of claim 1, wherein the liner has a thickness in a range of about 10 Å to about 50 Å.

10. The method of claim 1, wherein the liner is removed by a process comprising an anneal in an oxidizing atmosphere.

11. The method of claim 10, wherein the anneal is performed at a temperature greater than or equal to about 500° C.

12. The method of claim 10, wherein the liner comprises carbon and the liner is removed by a process further comprising an oxygen plasma ash.

13. The method of claim 12, wherein the oxygen plasma ash is performed at a temperature in a range of about 300° C. to about 400° C.

14. The method of claim 1, wherein each etch process is substantially directional.

15. A method of etching a film stack, the method comprising:
   providing a substrate with a film stack of a first thickness formed thereon, the film stack comprising alternating layers of an oxide and a nitride;
   forming a patterned hardmask on the film stack;
   etching the film stack through the patterned hardmask to a depth of a second thickness to form a gap with a substantially uniform width, a sidewall and a bottom, the second thickness being less than the first thickness;
   depositing a liner by atomic layer deposition on the sidewall and the bottom of the gap, the liner comprising boron and being conformal;
   etching the liner from the bottom of the gap;
   selectively etching the film stack relative to the liner to a depth of a third thickness to extend a depth of the gap; and
   performing an anneal of the substrate under an oxidizing atmosphere to remove the liner.

16. The method of claim 15, wherein the substantially uniform width is in a rage of about 10 nm to about 100 nm.

17. The method of claim 15, wherein the liner has a thickness in a range of about 10 Å to about 50 Å.

18. The method of claim 15, wherein the anneal is performed at a temperature greater than or equal to about 500° C.

19. A method of etching a film stack, the method comprising:
   providing a substrate with a film stack formed thereon of a first thickness in a range of about 3000 nm to about 7000 nm, the film stack comprising alternating layers of an oxide and a nitride;
   forming a patterned hardmask on the film stack with openings exposing the film stack, the openings having a width in a range of about 10 nm to about 100 nm;
   etching the film stack through the patterned hardmask to a depth of a second thickness to form a gap with a substantially uniform width, a sidewall and a bottom, the second thickness being less than the first thickness;

depositing a liner by atomic layer deposition on the sidewall and the bottom of the gap, the liner comprising boron and carbon and being substantially conformal;

etching the liner from the bottom of the gap;

selectively etching the film stack relative to the liner to a depth of a third thickness to extend a depth of the gap; and removing the liner by a process comprising:
  performing an anneal under a steam atmosphere at a temperature greater than or equal to about 500° C.; and
  performing an oxygen plasma ash at a temperature in a range of about 300° C. to about 400° C.

* * * * *